United States Patent
Cohen et al.

(10) Patent No.: US 8,557,665 B2
(45) Date of Patent: Oct. 15, 2013

(54) SELF-ALIGNED METAL-SEMICONDUCTOR ALLOY AND METALLIZATION FOR SUB-LITHOGRAPHIC SOURCE AND DRAIN CONTACTS

(75) Inventors: Guy M. Cohen, Mohegan Lake, NY (US); Paul M. Solomon, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 789 days.

(21) Appl. No.: 12/611,577

(22) Filed: Nov. 3, 2009

(65) Prior Publication Data
US 2010/0047984 A1  Feb. 25, 2010

Related U.S. Application Data

(62) Division of application No. 11/621,871, filed on Jan. 10, 2007, now Pat. No. 7,888,742.

(51) Int. Cl.
*H01L 21/336* (2006.01)

(52) U.S. Cl.
USPC .................................. 438/283; 257/E21.421

(58) Field of Classification Search
USPC .................................. 438/283; 257/E21.421
See application file for complete search history.

(56) References Cited

U.S. PATENT DOCUMENTS

| 5,773,331 | A | 6/1998 | Solomon et al. |
| 6,580,132 | B1 * | 6/2003 | Chan et al. ............ 257/365 |
| 6,642,115 | B1 | 11/2003 | Cohen et al. |

* cited by examiner

*Primary Examiner* — Fernando L Toledo
*Assistant Examiner* — Neil Prasad
(74) *Attorney, Agent, or Firm* — Scully, Scott, Murphy & Presser, P.C.; Vazken Alexanian

(57) ABSTRACT

A lateral double-gate FET structure with sub-lithographic source and drain regions is disclosed. The sub-lithographic source and drain regions are defined by a sacrificial spacer. Self-aligned metal-semiconductor alloy and metal contacts are made to the sub-lithographic source and drain using conventional silicon processing.

20 Claims, 5 Drawing Sheets

SELF-ALIGNED METAL-SEMICONDUCTOR ALLOY AND METALLIZATION FOR SUB-LITHOGRAPHIC SOURCE AND DRAIN CONTACTS

CROSS REFERENCE TO RELATED APPLICATION

This application is a divisional application of U.S. patent application Ser. No. 11/621,871, filed Jan. 10, 2007, now U.S. Pat. No. 7,888,742, the entire content and disclosure of which is incorporated herein by reference.

FIELD OF THE INVENTION

The present invention relates to contacts made to semiconductor devices, and more specifically to metal-semiconductor alloy (such as, for example, silicide or germanide) contacts with sub-lithographic dimensions made to the source and drain regions of a metal oxide semiconductor field effect transistor (MOSFET). The present invention also relates to a method of fabricating sub-lithographic contacts to the source and drain regions of the MOSFET.

BACKGROUND OF THE INVENTION

Double-gate MOSFETs have better scaling properties than the conventional single-gated MOSFETs. The two gates are preferably defined by a self-aligned process to minimize parasitic capacitance. Examples of such structures are described, for example, in U.S. Pat. No. 5,773,331 to Solomon et al., entitled "Method for making single and double gate field effect transistors with sidewall source-drain contacts" and in U.S. Pat. No. 6,642,115 to Cohen et al., entitled "Double-gate FET with planarized surfaces and self-aligned silicides".

FIG. 1 illustrates a typical double-gate MOSFET structure comprising a back gate A103, a back-gate dielectric A104, a semiconductor, typically silicon, channel A105, a top-gate dielectric A107, and a top-gate A108. Silicides A109 and A114 are formed over the top-gate A108 and the source and drain regions A115. The useful portion of the back-gate A103 is that segment which overlaps the channel region A105. The length of this segment is labeled in FIG. 1 as $L_{bg}$. The capacitance between the back-gate A103 and the channel A105 in that segment is $C_{bg}$. This is a useful capacitance since it allows the back-gate to control the charge in the channel. The back-gate A103 extends laterally by two segments of length $L_{ext\_s}$ and $L_{ext\_d}$. The length $L_{ext\_s}$ (and similarly $L_{ext\_d}$) is mainly determined by the size of the source/drain regions A115 lateral extension with a small addition that equals to the spacer A111 footprint. The capacitance between the back-gate A103 and the source and drain regions A115 is $C_{ext\_s}$ and $C_{ext\_d}$, respectively. This capacitance, also known as back-gate to source/drain overlap capacitance, is a parasitic capacitance and needs to be minimized in order to increase the overall speed of the semiconductor device.

To reduce the overlap capacitance to the back-gate, the lateral dimension of the source and drain regions needs to be minimized. For example, in Solomon et al., silicon raised source-drain spacers are formed so that the overlap area is reduced to that of the spacer footprint.

Sub-lithographic source and drain regions are, however, difficult to contact by subsequent metallization. By 'sub-lithographic', it is meant a dimension that is smaller than the minimum feature size that can be defined by conventional lithography.

In view of the foregoing, there is a need for providing a double-gate MOSFET with reduced source/drain to back-gate overlap capacitance. The present invention provides a method that is capable of reducing the overlap capacitance by making the size of source and drain regions to be as small as the footprint of a spacer. Additionally, the present invention provides a technique to form a metal-semiconductor alloy (such as, for example, silicide or germanide) and metallization to these sub-lithographic regions.

SUMMARY OF THE INVENTION

The present invention provides a planar double-gate MOSFET with sub-lithographic sized (on the order of about 0.1 microns or less) source and drain regions to which self-aligned metal-semiconductor alloy (such as, for example, silicide or germanide) and metal contacts are made.

The inventive structure and method provide several advantages over the prior art. First, the present invention minimizes the parasitic component of the capacitance between the source region, the drain region, and the back-gate. Secondly, the present invention provides a self-align silicide (SALICIDE) process for forming silicide (or other metal-semiconductor alloy) regions over the source region, the drain region and the top-gate that avoid lithography. Third, the inventive method forms metal contacts to the metal-semiconductor alloy (such as, for example, silicide or germanide) regions of the source and drain regions without the use of lithography.

In a first aspect of the present invention, a semiconductor structure such as a double-gate field effect transistor (FET) is provided that comprises:
a single-crystal semiconductor channel;
a top-gate and a back-gate on either side of the semiconductor channel for controlling the current through the semiconductor channel;
a source region and a drain region adjacent to the semiconductor channel, said source and drain regions have a lateral size defined by a footprint of a spacer;
metal-semiconductor alloy regions over the source region, the drain region, and optionally the top-gate; and
buried metal lines connecting to an edge of said metal-semiconductor alloy regions.

In some embodiments, the inventive structure further includes metal studs connecting to the buried metal lines.

In a second aspect of the present invention, a method for fabricating a semiconductor structure such as a double-gate FET with sub-lithographic source and drain regions is described. The starting structure employed in the inventive method includes a single-crystal semiconductor (preferably Si-containing) channel with a gate dielectric on top and bottom surfaces of the channel. A conductive film under the bottom gate dielectric forms the back-gate of the device. Another conductive film over the top gate dielectric is patterned to form the top-gate of the device. Sidewalls spacers are formed adjacent to the top-gate. Source and drain regions are then defined by the footprint of the sidewall spacers formed adjacent to the top-gate. This is achieved by blanket etching the material of the semiconductor channel from everywhere except where the top-gate and sidewall spacers are masking the etching. The structure is then planarized by an oxide deposition, which is followed by chemical mechanical polishing (CMP) that aligns the top surface of the oxide with the top surface of the top-gate. The oxide is recessed below the upper surface of the top-gate. The sidewall spacers are then removed to expose the top surface of the source and drain regions of the device.

In a preferred embodiment of the present invention, the source and drain regions are thicken by selective epitaxy. A blanket metal film is deposited and patterned by the mask that originally defined the semiconductor channel before it was trimmed by the blanket etching (this is typically the mask used to define the shallow trench isolation). The structure is then planarized by a second oxide deposition and CMP such that the upper surface of the top-gate is exposed by the CMP process. Annealing reacts the metal film with the source and drain regions (and the top surface of the gate) forming metal-semiconductor alloys such as silicides or germanides. Unreacted metal remains under the planarizing oxide and over the dielectric sidewalls of the top-gate. The unreacted metal on the sidewalls of the top-gate is selectively etched with respect to the metal-semiconductor alloy. The unreacted metal buried under the planarizing oxide is protected from etching and remains in contact with the metal-semiconductor alloy over the source and drain regions. Source/drain contacts are then made to the unreacted metal using vias studs (CA mask).

In general terms, the inventive method, which was described above, includes the steps of:

forming a structure including a single-crystal semiconductor film with a gate dielectric on its top and bottom surfaces, a bottom-gate, and a top-gate with dielectric sidewall spacers;

forming sacrificial spacers adjacent to said top-gate;

defining sub-lithographic source and drain regions by etching unmasked regions of said single-crystal semiconductor film;

providing a first planarized dielectric on said structure;

recessing said first planarized dielectric below an upper surface of said top-gate;

removing said sacrificial spacers to expose top surfaces of said sub-lithographic defined source and drain regions;

forming a metal-semiconductor alloy on said exposed surfaces of said source and drain regions utilizing a metal film, wherein a portion of said metal film which does not form a metal-semiconductor alloy is located atop the first planarized dielectric;

depositing a second planarized dielectric over at least said metal-semiconductor alloy; and etching selectively said metal over said dielectric sidewall spacers.

DETAILED DESCRIPTION OF THE INVENTION

The present invention, which provides a double-gate FET with sub-lithographic source and drain regions as well as a method for fabricating the same, will now be described in greater detail by referring to the following discussion. In this discussion, reference will be made to various drawings that illustrate embodiments of the present invention. Since the drawings of the embodiments of the present invention are provided for illustrative purposes, the structures contained therein are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced with viable alternative process options without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

A stated above, the present invention provides a planar double-gate MOSFET with sub-lithographic sized (on the order of about 0.1 microns or less) source and drain regions to which self-aligned metal-semiconductor alloy and metal contacts are made. The present invention minimizes the parasitic component of the capacitance between the source region, the drain region, and the back-gate, it provides a self-align metal-semiconductor alloy (e.g., SALICIDE) process for forming metal-semiconductor alloy regions over the source region, drain region and the top-gate that avoid lithography, and it forms metal contacts to the metal-semiconductor alloy regions of the source and drain regions without the use of lithography.

Figure 1:
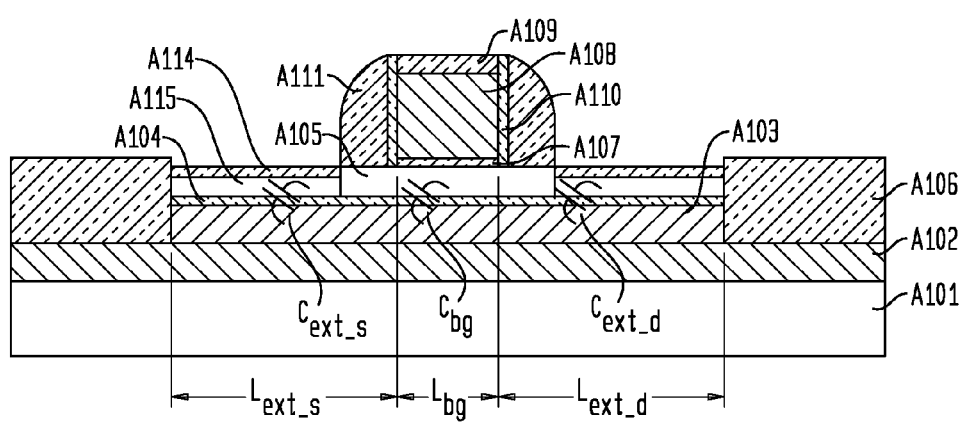
FIG. 1 is pictorial representation (through a cross sectional view) illustrating a prior art double-gate FET in which the back-gate to channel capacitance and the back-gate to source/drain parasitic capacitance are shown.
Figure 2:
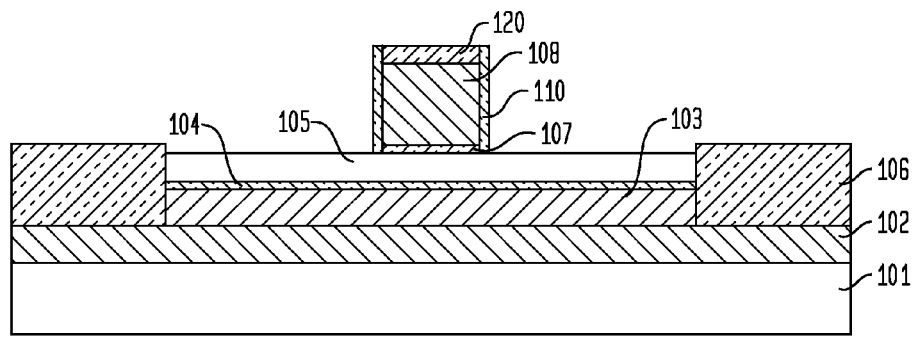
FIGS. 2-9 are pictorial representations (through cross sectional views) illustrating the basic processing steps of the present invention for fabricating a double-gate FET with sub-lithographic source and drain regions.
Figure 8:
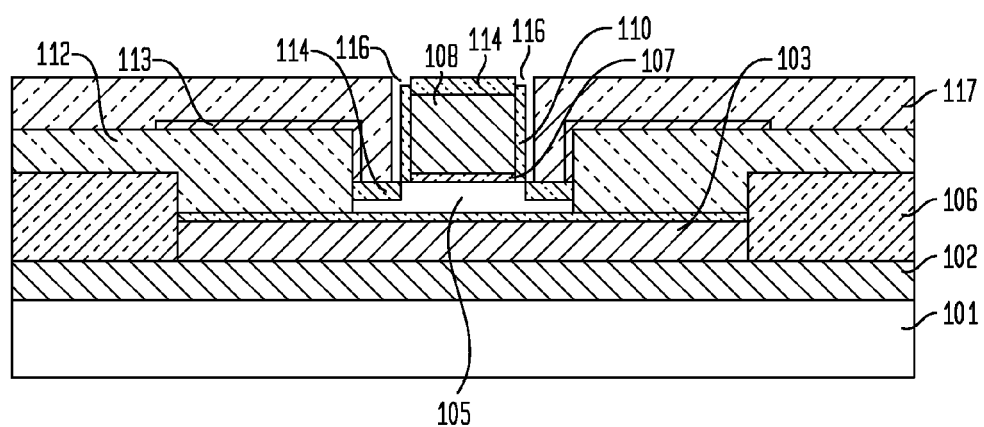
Figure 9:
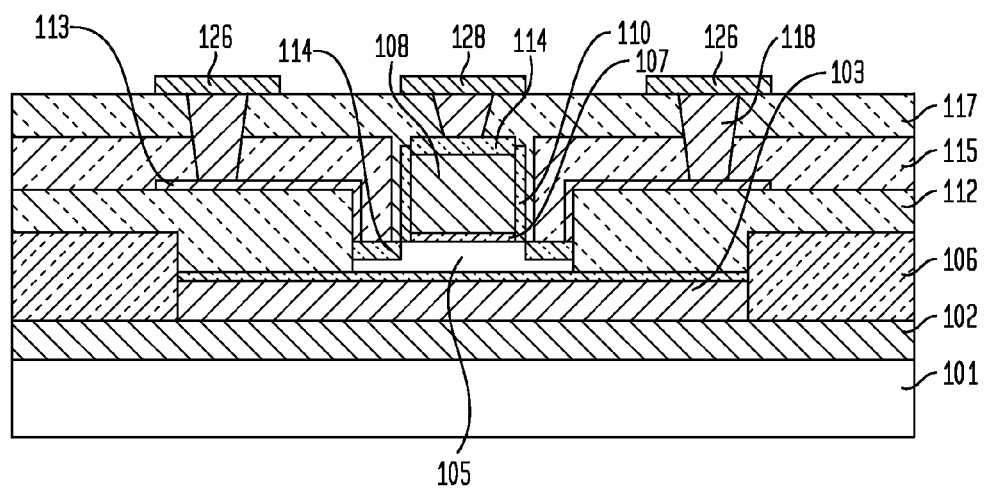
Figure 10:
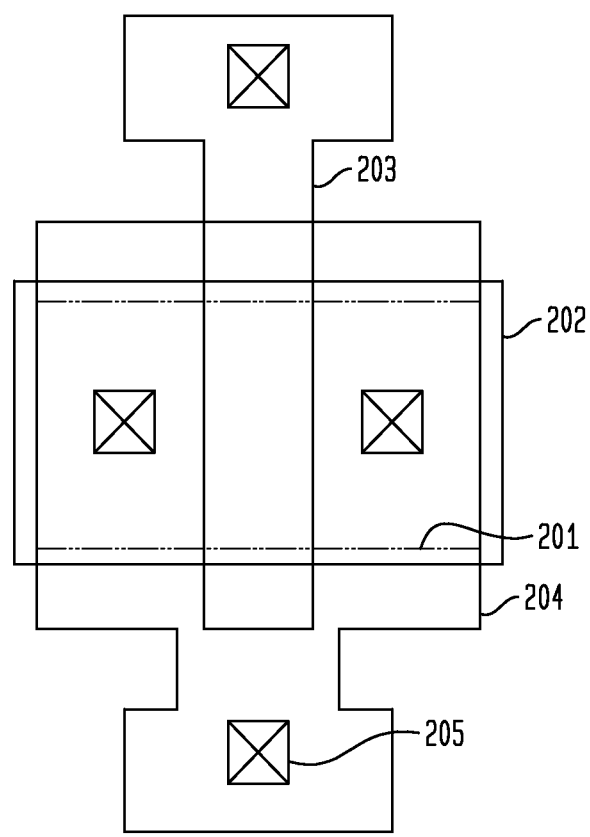
FIG. 10 is a pictorial representation (top view) illustrating the basic mask set used for fabricating the inventive double-gate FET with sub-lithographic source and drain regions.

The basic processing steps of the inventive method are shown in FIGS. 2-9, while FIG. 10 shows the mask set that is used in the inventive method for fabricating the inventive planar double-gate FET. Referring to FIG. 2, there is shown an initial structure that is employed in the present invention. The initial structure shown in FIG. 2 includes a substrate that includes a semiconductor wafer 101, a buried insulator 102, a back-gate film 103 with a back-gate dielectric film 104, and a single-crystal semiconductor film (SOI) 105. The substrate is typically fabricated by well known wafer bonding and layer transfer techniques.

In accordance with the present invention, the semiconductor wafer 101 and the single-crystal semiconductor film 105 are comprised of the same or different, preferably the same, semiconductor material. The term "semiconductor material" denotes any material that has semiconductor properties including, for example, Si, SiGe, SiC, SiGeC, Ge, GaAs, InAs, InP as well as other III/V or II/VI compound semiconductors. Preferably, the semiconductor material of semiconductor wafer 101 and single-crystal semiconductor film 105 are Si-containing semiconductors, with Si being most preferred.

In the initial structure shown in FIG. 2, the buried insulator 102 comprises an oxide, a nitride, an oxynitride or any combination thereof with an oxide being most preferred. The back-gate dielectric 104 comprising an insulating material including oxides, nitrides, oxynitrides or combinations and multilayers thereof. Typically, the back-gate dielectric 104 is comprised of $SiO_2$. The back-gate 103 comprises any conductive material including polysilicon or SiGe that is doped with an n or p-type dopant to a dopant concentration of about 5E19 atoms/cm³ or greater, a metal such as, for example, Al, W, Mo, a metal alloy, a metal silicide, or a metal nitride.

The films 103-105 are patterned into isolated regions (one of which is shown in FIG. 2) by utilizing a conventional shallow trench isolation (STI) process. Each of the isolated regions is isolated from its neighbors by a shallow trench isolation region 106. The shallow trench isolation region 106 is typically filled with a trench dielectric material such, for example, an oxide.

A top-gate stack including a top-gate dielectric 107, a top-gate 108, a gate cap 120 and sidewall spacers 110, are fabricated over the single-crystal semiconductor film 105 utilizing well known processes. Source and drain regions on either side of the top-gate 108 are formed by a self-aligned ion implantation into the single-crystal film 105. It is noted that the top-gate 108 may comprise the same or different conductive material as that of the back-gate film 103. Also, the top-gate dielectric 107 may be comprised of the same or different insulator as that of the back-gate dielectric film 104.

The gate cap 120 is comprised on an insulating material including, for example, an oxide, nitride, oxynitride or multilayers thereof. Typically, the gate cap 120 is comprised of an oxide such as $SiO_2$. In accordance with the present invention, the sidewall spacers 110 are comprised of an oxide such as $SiO_2$.

Figure 3:
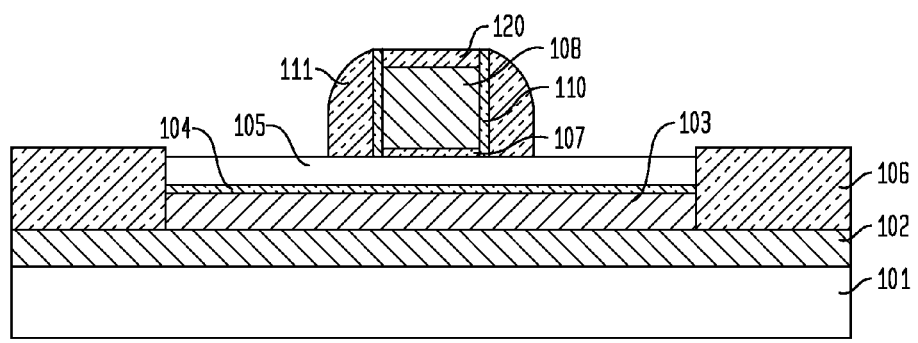
Figure 4:
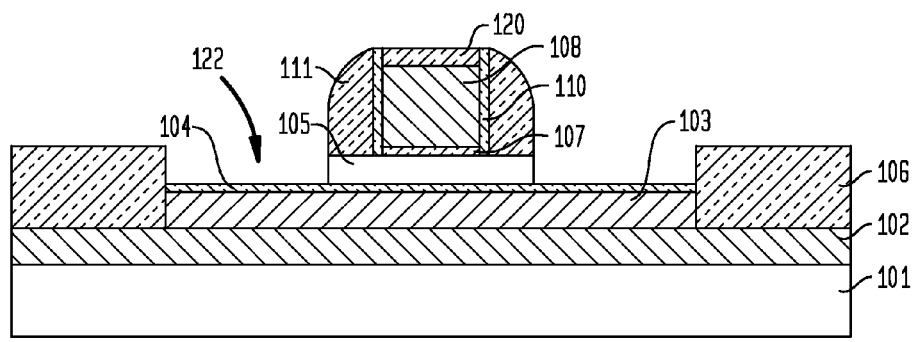

Referring to FIG. 3 sacrificial spacers 111 which are comprised of silicon nitride are formed on either side of the gate stack. The sacrificial spacers 111 are formed by deposition and etching. The width of each of the sacrificial spacer's 111 footprint will later define the lateral size of the source and drain regions. As illustrated in FIG. 4, reactive ion etching (RIE) is used to etch the single-crystal semiconductor film 105 from regions where it is not masked by the gate stack or the sacrificial spacers 111. In FIG. 4, reference numeral 122 refers to the etched area. The semiconductor etch is selective to dielectrics such as silicon dioxide ($SiO_2$) and silicon nitride ($Si_3N_4$). As an example, RIE with HBr chemistry can have a typical etch selectivity larger than 1:100 (i.e., oxide etching is 100 times slower than semiconductor etching). The high selectivity also enables the etching in the 122 regions to stop on the back-gate dielectric 104.

Figure 5:
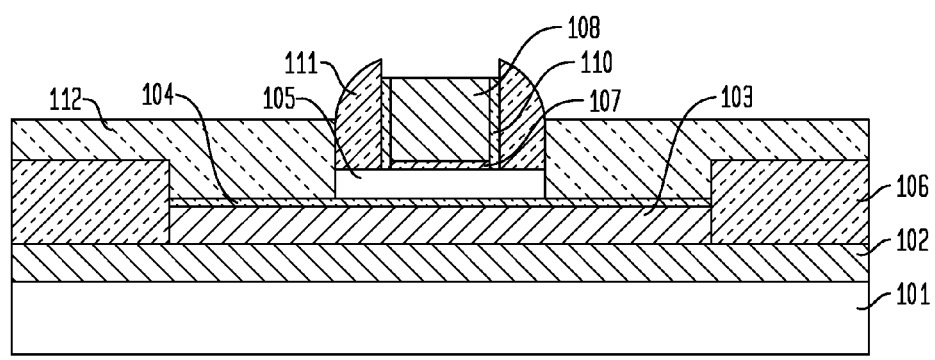

Referring to FIG. 5, an insulator 112 such as an oxide or silicate glass is blanket deposited, and chemical mechanical polishing (CMP) is applied to planarize the surface. The insulator 112 is polished down to the upper surface of the gate cap 120. The insulator 112 is then recessed further below the upper surface of the gate cap 120. The gate cap 120 is also removed to expose the top surface of the top-gate 108.

Figure 6:
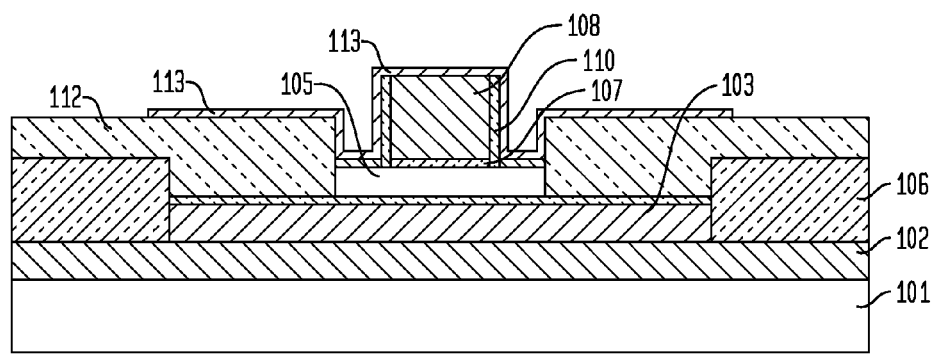

Referring to FIG. 6, the sacrificial spacers 111 are selectively removed by etching to expose the top surface of the remaining singe-crystal semiconductor film 105. Since the single-crystal semiconductor film 105 is typically made thin (on the order of about 30 nm or less) to achieve double-gate operation, the exposed single-crystal semiconductor typically has to be thickened prior to silicide formation. The exposed portions of the single-crystal semiconductor film 105 are thickened by selective epitaxy (i.e., additional semiconductor material 150 is deposited only over the exposed surfaces of the semiconductor film 105, but not over dielectric surfaces). The added semiconductor material 150 is sometimes referred to as raised source/drain regions since it extends (thicken) the device source and drain regions. Ion implantation is typically used to dope the raised source and drain regions.

A metal 113 capable of reacting with the semiconductor 150 to form a metal-semiconductor alloy (for example, silicide when silicon is used, or germanide when germanium is used) is blanket deposited over the structure. Examples of such metals that can react with a semiconductor to form a silicide (or germanide) include, for example, Ni, Ti, Pt, W, Co or multilayers or combinations thereof. Typically, the metal 113 is one of Ni, Pt and Co. The metal 113 is patterned with a mask 202 (see FIG. 10) that is slightly larger than the mask 201 that defines the isolated regions, or it may be patterned just with the STI mask 201. FIG. 10 shows the layout of mask 202 overlaid over the top-gate mask 203, the bottom-gate mask 204, and the STI mask 201.

Figure 7:
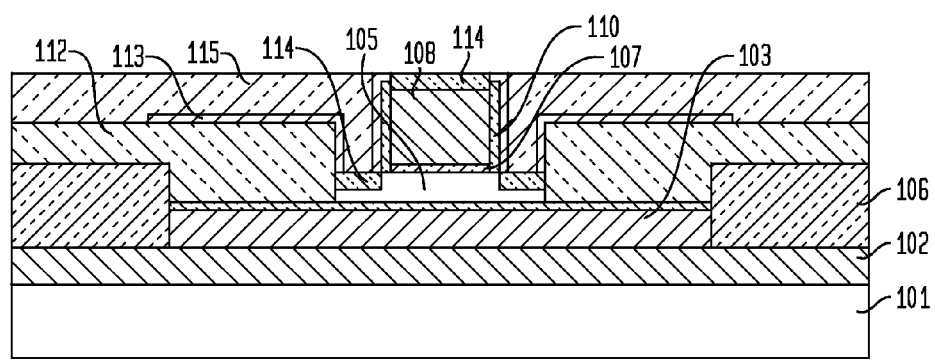

Referring to FIG. 7, metal-semiconductor alloy 114 is formed by reacting the metal 113 with the semiconductor 150, the top portion of semiconductor 105 (optional), and the top surface of the top-gate 108 (assuming a Si-containing gate). The portions of metal 113 not in contact with a semiconductor surface, e.g., over the spacers 110 and over the insulator 112, do not convert into a metal-semiconductor alloy. In a preferred embodiment of the present invention, the metal-semiconductor alloy 114 is one of NiSi, $TiSi_2$, $CoSi_2$ and $PtSi_2$. Reacting the metal with the semiconductor surface is typically done by rapid thermal annealing (RTA) of the wafer. An insulator 115 such as, for example, an oxide or silicate glass, is blanket deposited over the structure. The structure is polished by CMP, such that the metal-semiconductor alloy 114 on the top of the top-gate 108 is exposed. It is also possible to deposit the insulator 115 prior to reacting metal 113 with the semiconductor surface, and then perform the RTA step with the dielectric 115 covering the metal 113.

Referring to FIG. 8, the unreacted metal 113 over the spacers 110 is selectively etched with respect to the metal-semiconductor alloy 114 and the insulators. The unreacted metal 113 over the insulator 112 is not etched since it is protected by the insulator 115. The remaining unreacted metal 113 forms buried metal lines within the structure that are connected to the edges of the source/drain regions.

Referring to FIG. 9 an insulator 117 such as an oxide or silicate glass is blanket deposited over the structure. Insulator 117 also fills the gap 116 left by the etched metal 113. CMP is used to planarize the structure. Contact vias to the source, drain and gate are defined by lithography and RIE and filled with a metal forming metal studs 118. Metal studs 118 comprise Al, W, Cu AlCu or other like conductive metals.

To complete the device fabrication, metal lines 126 and 128 are formed to contact the source/drain regions and the top-gate, respectively.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a double-gate FET comprising:
   forming a structure including a single-crystal semiconductor film with a gate dielectric on its top and bottom surfaces, a bottom-gate, and a top-gate with dielectric sidewall spacers;
   implanting ions into said single-crystal semiconductor film forming a source region and a drain region in said single-crystal semiconductor film and on opposing sides of the top-gate;
   forming sacrificial spacers adjacent a sidewall of said top-gate and directly on a portion of said single-crystal semiconductor film;

defining sub-lithographic source and drain regions by etching unmasked regions of said single-crystal semiconductor film, a portion of said source region, and a portion of said drain region not protected by said sacrificial spacers and said top-gate, wherein a single-crystal semiconductor film portion is provided beneath the sacrificial spacers and said top-gate and has sidewall edges that are vertical coincident to sidewall edges of said sacrificial spacers;

providing a first planarized dielectric on said structure;

recessing said first planarized dielectric below an upper surface of said top-gate;

removing said sacrificial spacers to expose top surfaces of said sub-lithographic defined source and drain regions;

forming a metal-semiconductor alloy on said exposed surfaces of said source and drain regions utilizing a metal film, wherein a portion of said metal film which does not form a metal-semiconductor alloy is located atop the first planarized dielectric;

depositing a second planarized dielectric over at least said metal-semiconductor alloy; and etching selectively said metal over said dielectric sidewall spacers.

2. The method of claim 1 further comprising forming vias to said metal covered by said second planarized dielectric.

3. The method of claim 1 further comprising thickening said source and said drain regions to form a raised source and drain.

4. The method of claim 3 wherein said thickening is provided by selective epitaxy.

5. The method of claim 1 wherein portions of said metal film that are not converted to said metal-semiconductor alloy and which are protected by said second planarized dielectric form buried metal lines that are connected to an edge of said source and drain regions.

6. The method of claim 1 wherein said sub-lithographic source and drain regions have a size of 0.1 microns or less.

7. The method of claim 1 wherein said sacrificial spacers have a width at their footprint that defines the lateral width of said sub-lithographic source and drain regions.

8. The method of claim 1 wherein said removing the sacrificial spacers includes a reactive ion etch process.

9. The method of claim 1 wherein providing the first planarized dielectric includes deposition of an insulator, followed by chemical mechanical planarization.

10. The method of claim 1 wherein said etching unmasked regions of said single-crystal semiconductor film forms a single-crystal semiconductor film portion having a thickness of about 30 nm or less.

11. A method of forming a double-gate FET comprising:

forming a structure including a single-crystal semiconductor film with a gate dielectric on its top and bottom surfaces, a bottom-gate, and a top-gate with dielectric sidewall spacers;

implanting ions into said single-crystal semiconductor film forming a source region and a drain region in said single-crystal semiconductor film and on opposing sides of the top-gate forming sacrificial spacers adjacent a sidewall of said top-gate and directly on a portion of said single-crystal semiconductor film;

defining sub-lithographic source and drain regions by etching unmasked regions of said single-crystal semiconductor film, a portion of said source region, and a portion of said drain region not protected by said sacrificial spacers and said top-gate, wherein a single-crystal semiconductor film portion is provided beneath the sacrificial spacers and said top-gate and has sidewall edges that are vertical coincident to sidewall edges of said sacrificial spacers;

providing a first planarized dielectric on said structure;

recessing said first planarized dielectric below an upper surface of said top-gate;

removing said sacrificial spacers to expose top surfaces of said sub-lithographic defined source and drain regions; and forming a metal-semiconductor alloy on said exposed surfaces of said source and drain regions utilizing a metal film, wherein a portion of said metal film which does not form a metal-semiconductor alloy is located atop the first planarized dielectric.

12. The method of claim 11 further comprising forming vias to said metal covered by said second planarized dielectric.

13. The method of claim 11 further comprising thickening said source and said drain regions to form a raised source and drain.

14. The method of claim 13 wherein said thickening is provided by selective epitaxy.

15. The method of claim 11 wherein portions of said metal film that are not converted to said metal-semiconductor alloy and which are protected by a subsequently formed second planarized dielectric form buried metal lines that are connected to an edge of said source and drain regions.

16. The method of claim 11 wherein said sub-lithographic source and drain regions have a size of 0.1 microns or less.

17. The method of claim 11 wherein said sacrificial spacers have a width at their footprint that defines the lateral width of said sub-lithographic source and drain regions.

18. The method of claim 11 wherein said removing the sacrificial spacers includes a reactive ion etch process.

19. The method of claim 11 wherein providing the first planarized dielectric includes deposition of an insulator, followed by chemical mechanical planarization.

20. The method of claim 11 wherein said etching unmasked regions of said single-crystal semiconductor film forms a single-crystal semiconductor film portion having a thickness of about 30 nm or less.

* * * * *